United States Patent [19]

Paparo et al.

[11] Patent Number: 5,475,273
[45] Date of Patent: Dec. 12, 1995

[54] SMART POWER INTEGRATED CIRCUIT WITH DYNAMIC ISOLATION

[76] Inventors: Mario Paparo, 17197 N. Laurel Park Dr., Ste. 253, Livonia, Mich. 48152; Raffaele Zambrano, 43/A Via Duca d'Aosta, 95037 San Giovanni la Punta Ct, Italy

[21] Appl. No.: 987,768

[22] Filed: Dec. 7, 1992

[30] Foreign Application Priority Data

Dec. 5, 1991 [IT] Italy ............................. MI91A3265

[51] Int. Cl.$^6$ ........................................... H03K 3/01
[52] U.S. Cl. .................... 327/545; 327/564; 327/77; 327/535; 327/434
[58] Field of Search ................................. 257/546, 547; 307/303, 303.2, 296.2, 296.4, 362, 360

[56] References Cited

U.S. PATENT DOCUMENTS

| | | | |
|---|---|---|---|
| 3,931,634 | 1/1976 | Knight | 257/547 |
| 4,336,466 | 6/1982 | Sud et al. | 307/296.2 |
| 4,426,658 | 1/1984 | Gontowski, Jr. | 257/546 |
| 4,496,849 | 1/1985 | Kotowski | 257/547 |
| 4,675,561 | 6/1987 | Bowers | 307/303.2 |
| 4,789,917 | 12/1988 | Miller | 257/546 |
| 4,800,418 | 1/1989 | Natsui | 307/303 |
| 4,890,149 | 12/1989 | Bertotti | 257/547 |
| 4,941,030 | 7/1990 | Majumdar | 307/303 |
| 4,972,247 | 11/1990 | Patterson et al. | 257/546 |
| 4,992,836 | 2/1991 | Sicard | 257/546 |
| 5,051,612 | 9/1991 | Agiman | 307/303 |
| 5,124,761 | 6/1992 | Senuma et al. | 307/303 |
| 5,132,866 | 7/1992 | Raciti et al. | 307/303 |
| 5,159,207 | 10/1992 | Pavlin et al. | |

FOREIGN PATENT DOCUMENTS

| | | | |
|---|---|---|---|
| 0432058A1 | 11/1990 | France . | |
| 1101068 | 5/1986 | Japan | 257/547 |
| 3155757 | 6/1988 | Japan | 257/547 |
| 4077155 | 3/1989 | Japan | 257/547 |

OTHER PUBLICATIONS

Wrathall et al., "Integrated Circuits for the Control of High Power," 1983 IEDM Technical Digest, paper No. 16.1, at pp. 408ff.

Baliga, "An overview of smart power technology," 38 IEEE Transactions on Electron Devices 1568 (1991).

Berta et al., "A simplified low-voltage smart power technology," 12 IEEE Electron Device Letters 465 (1991).

*Primary Examiner*—Timothy P. Callahan
*Assistant Examiner*—T. Lam

[57] ABSTRACT

A smart power integrated circuit with dynamic isolation. A P-type isolation region surrounds the small signal devices (npn bipolar transistors and possibly other devices). This isolation region is held at ground in normal operation; but one or more pilot circuits continually monitor the collector voltages of the small-signal and power npn transistors, and instantly reconnect this isolation region, in real time, to the lowest collector voltage, whenever any of the collector voltages go below ground. Preferably a large capacitor provides a dedicated supply to the pilot circuit, so that the reconnection operation can proceed even when a power supply glitch occurs.

30 Claims, 11 Drawing Sheets

SMART POWER INTEGRATED CIRCUIT WITH DYNAMIC ISOLATION

BACKGROUND AND SUMMARY OF THE INVENTION

The present invention relates to dynamically isolated smart power integrated circuits.

A large amount of effort has been devoted to integrating high-density small-signal devices on a single integrated circuit with power devices. Such integrated circuits are commonly referred to as "smart power" circuits. However, the incompatibilities between vertical and planar processes have caused many difficulties in achieving such integration. Some general review of this class of integrated circuits can be found in Wrathall et al., "Integrated Circuits for the Control of High Power," 1983 *IEDM Technical Digest,* paper no. 16.1, at pp. 408ff, which is hereby incorporated by reference, and in Baliga, "An overview of smart power technology," 38 IEEE TRANSACTIONS ON ELECTRON DEVICES 1568 (1991), and references cited therein, all of which are hereby incorporated by reference. Reference is also made to Berta et al., "A simplified low-voltage smart power technology," 12 IEEE ELECTRON DEVICE LETTERS 465 (1991). Such integrated circuits are desirable for many applications, including but not limited to linear voltage regulators, switching voltage regulators, AC motor control, fluorescent light ballasts, automotive controls, etc.

Such smart power chips normally include an isolation region designed to ensure electric isolation of the individual components, and therefore correct operation of the device. For simplicity of fabrication, this isolation region is typically a semiconductor region (such as region 3 in FIG. 1 ) which is doped to provide junction isolation. For this isolation region to fulfill its function, it is necessary that both of its junctions be normally reverse biased. This is achieved by connecting the isolation region to a potential not greater than the minimum voltage applied to the device. Therefore, since the terminal with potential lower than the supply battery is normally grounded, the isolation region is also grounded for the above reasons.

Note that this junction isolation defines a parasitic transistor. In the sample structure of FIG. 1, the parasitic transistor is predominantly vertical, and is defined by N-type region 4 (the logic device's collector), which overlies P-type region 3 (the isolation region), which overlies N-type regions 1 and 2 (the power device's collector). Typical applied voltages of these regions, in normal operation, would be a few Volts on region 4 (from connection $C_1$), ground potential on region 3, and several tens of volts on regions 1 and 2 (from terminal $C_p$). Thus, if this parasitic transistor were to turn on, region 4 could act as an emitter, and the large voltage difference between terminal $C_p$ and $C_1$ could cause very large currents, and destruction of portions of the integrated circuit.

Merely grounding terminal ISO, in a junction isolation structure like that of FIG. 1, is not effective in many cases. For example, it can happen that, upon the occurrence of spurious pulses on the power supply lines, or upon the occurrence of transients due to switching of an inductive load, the voltage (Vout) of the collector ($C_p$) of the power transistor displays transiently negative values. This common occurrence is referred to as a "subground" situation.

To prevent the parasitic vertical transistor from going into conduction when a subground situation occurs, there has been conceived a dynamic isolation circuit which calls for keeping the connection of the isolation region grounded when the Vout is positive and switching the grounding into a connection to the power transistor collector when the Vout displays subground transients. This circuit is described in U.S. Pat. No. 5,159,202, corresponding to French patent application no. 89/16144, which is hereby incorporated by reference.

However, the present inventors have discovered that this dynamic isolation circuit does not prevent the parasitic vertical transistor from going into conduction, in some cases, when negative voltage transients are applied to the control circuit.

The present invention provides a smart power integrated circuit with a more complex dynamic isolation circuit. This more complex dynamic isolation circuit holds the isolation region to the lowest potential present on-chip. This is done on the fly, preferably by using MOSFETs to reconnect the isolation region to one of at least two collector potentials whenever any of them has a subground voltage.

In the presently preferred embodiment, as in the conventional device structure of FIG. 1, a P-type isolation region surrounds the small signal devices (npn bipolar transistors and possibly other devices). This isolation region is held at ground in normal operation; but one or more pilot circuits continually monitor the collector voltages of the small-signal and power npn transistors, and instantly reconnect this isolation region, in real time, to the lowest collector voltage, whenever any of the collector voltages go below ground. Preferably a large capacitor provides a dedicated supply to the pilot circuit, so that the reconnection operation can proceed even when a power supply glitch occurs.

The present invention allows achievement of at least the following advantages:

provision of a semiconductor electronic device with dynamic isolation circuit ensuring isolation conditions even with negative voltage transients on the control circuit, reduction of implementation costs of the described dynamic isolation principle by means of integrated structures not requiring a polycrystalline silicon process, extension and optimization of the decisional circuitry part dedicated to piloting the synchronous switches which provide the dynamic isolation, and dynamic isolation of different isolation regions not connected together with variation of the voltage applied to the common substrate.

In the presently preferred embodiment, the semiconductor electronic device with dynamic isolation includes at least one power transistor and at least one control circuit integrated monolithically in the same chip, and also: one isolation region designed to isolate the individual components of the control circuit from each other and from the power transistor, a first switch designed to connect the isolation region with a ground node, a second switch designed to connect the isolation region with the collector or drain of the power transistor, a pilot circuit connected with the collector or drain of the power transistor, with the ground node and with the first and second switches which, depending on whether the collector or drain has potential greater or less respectively than that of ground, commands closing of the first or second switch respectively, there is present a third switch (S3) designed to connect the isolation region with a region of a control circuit transistor, the pilot circuit is connected with the third switch (S3) and with the region of the control circuit transistor and commands closing of the third switch and opening of the first when the region of the control circuit transistor has potential less than that of ground. Other inventive solutions are indicated below in the claims.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
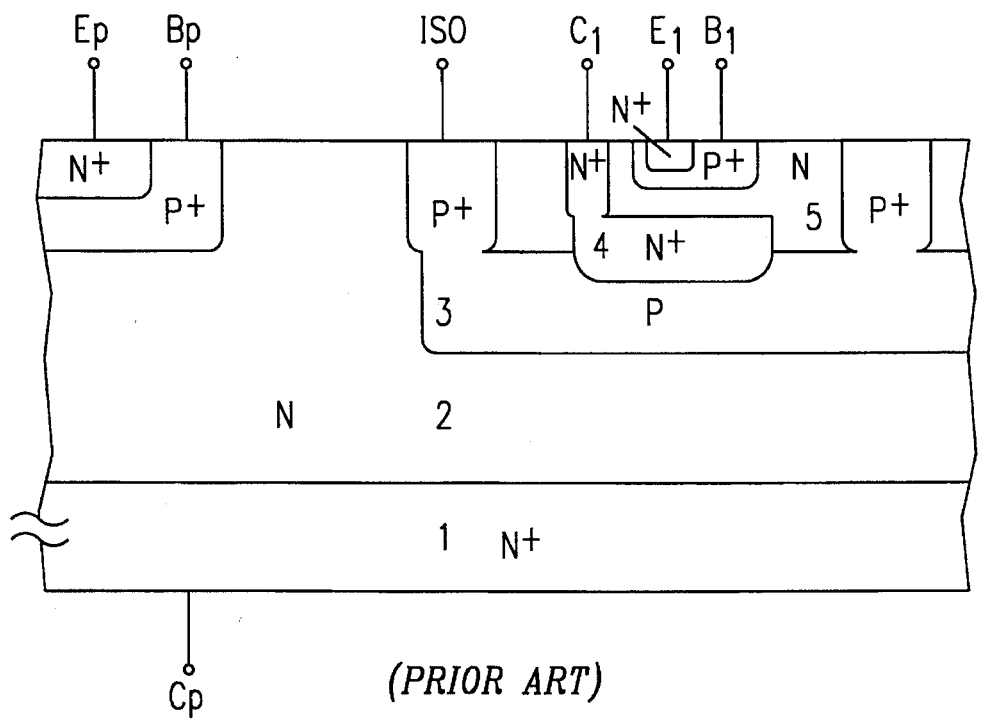
FIG. 1 shows an example of a structure comprising a power transistor, a control transistor and an isolation region.

FIG. 1 shows an example of a structure of a semiconductor electronic device comprising a power stage and a control circuit. For the sake of simplicity, this Figure illustrates only one component of the integrated control circuit (a low voltage npn transistor with emitter, base and collector terminals indicated by $E_1$, $B_1$ and $C_1$ respectively), and a single power transistor (also of the npn type and having emitter, base and collector terminals indicated by $E_p$, $B_p$ and $C_p$ respectively). While this structure is sufficient to illustrate the principles of operation of the invention, it should be appreciated that the disclosed inventions can also be applied to integrated circuits using a wide variety of other device types in the small-signal portion of the chip. For example, the disclosed innovations can be applied to chips in which at least portions of the small-signal devices include NMOS, CMOS, BiCMOS (bipolar-plus-CMOS), or CBCMOS (complementary-bipolar-plus-CMOS) technologies. Similarly, the disclosed dynamic isolation operation can also be applied to smart power integrated circuits using a DMOS rather than bipolar power device.

Terminal $E_p$, together with the "−" terminal of the power supply is designed to be grounded (directly or through one or more passive components inside or outside the monolithic circuit).

In the Figure, 1 represents a substrate of N+ doped semiconductor material, 2 represents an N doped layer, and 3 represents a P-type isolation region. Isolation region 3 will isolate the individual components of the control circuit from each other, and from the power transistor, provided that the ISO terminal is grounded (or held to a lower potential if one is present on-chip), as to ensure that both the junctions of the parasitic transistor associated with the isolation region are always reverse biased.

Figure 2:
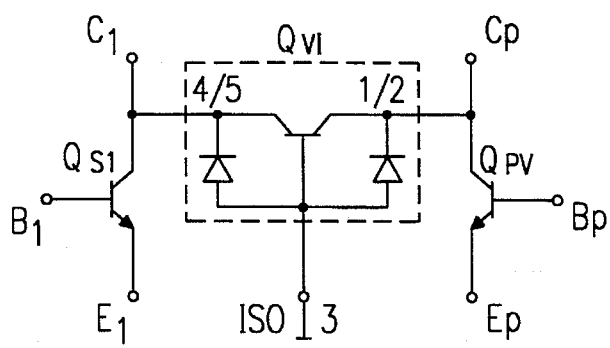
FIG. 2 shows an equivalent circuit of the structure of FIG. 1.

FIG. 2 shows the equivalent electric circuit of the structure of FIG. 1. It shows the npn vertical parasitic transistor (Qvi) which, with both junctions normally reverse biased, ensures isolation between the vertical power transistor (Qpv) and the signal transistor (Qs1) of the pilot circuit provided inside the layer 3. For clear analysis, note that the two junctions are shown separately as diodes: one diode is defined by the boundary between n-type regions 4 (or 5) and p-type region 3; the other diode is defined by the boundary between n-type regions 2 (and 1) and p-type region 3.

Figure 3:
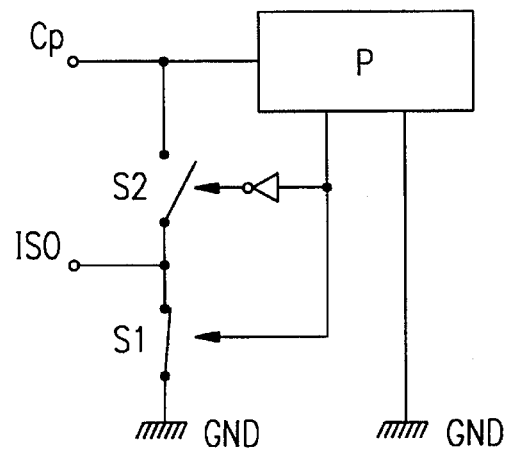
FIG. 3 shows the basic diagram of a known dynamic isolation circuit.

FIG. 3 illustrates the basic diagram of the dynamic isolation circuit as previously proposed (in French patent application no. 89/16144). In this Figure, reference "P" represents a pilot circuit which detects the voltage level of the collector $C_p$ of the power transistor. Pilot circuit P holds the switch S1 (consisting of a vertical MOS transistor or a bipolar transistor) closed, and the switch S2 (consisting of a lateral MOS transistor) open, as long as the voltage on terminal $C_p$ is greater than the ground potential. As soon as the voltage of $C_p$ falls below the ground potential (even transiently), P commands opening of S1 and simultaneously closing of the switch S2.

Figure 4A:
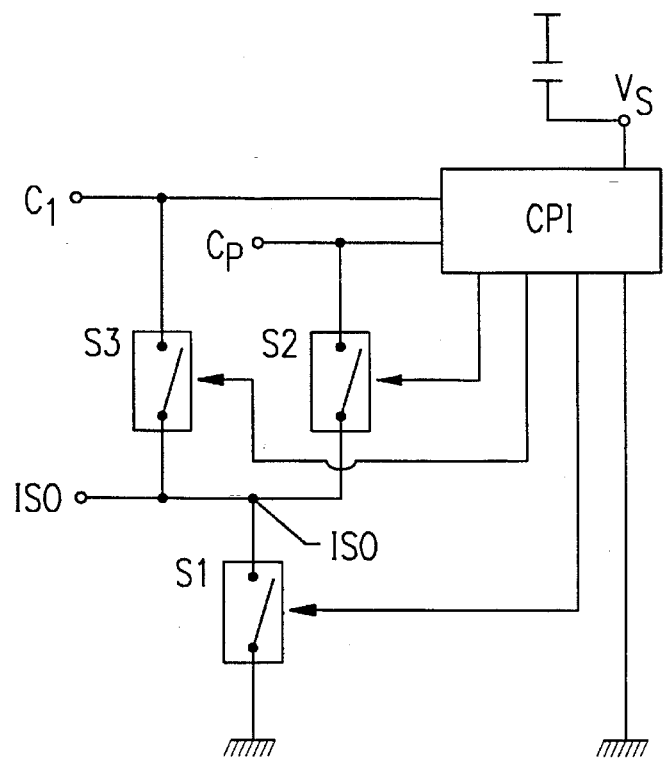
FIG. 4a shows the basic diagram of the dynamic isolation circuit in accordance with a first class of embodiments of the present invention.

FIG. 4a illustrates the basic diagram of a sample embodiment of the dynamic isolation circuit according of the present invention. As shown in this Figure, the switch piloting circuit CP monitors not only the voltage level of the collector $C_p$ of the power transistor, but also the level of the collector $C_1$ of the control circuit. As long as the voltage of $C_p$ and $C_1$ is greater than the voltage of the ground node, CP holds the switch S1 closed and the switches S2 and S3 open. As soon as the potential of $C_p$ or $C_1$ falls transiently below ground potential, CP commands opening of S1 and closing of S2 or S3 respectively, i.e. it commands closing of the switch connected to the terminal from which arrives the most negative disturbance.

If in the integrated circuit there exist other terminals subject to transient subground situations, the solution described above can readily be adapted, by adding more switches (in addition to S2 and S3) to equal the total number of such terminals.

The circuit of FIG. 4a, whose reference potential is ground, preferably uses a separate supply $V_s$ of the circuit CP designed to permit supply of CP even during subground transients. This separate supply, without interruptions, can be for example achieved simply by keeping uniformly charged a capacitance designed to supply power to CP during the transients. The size of the supply capacitor for the pilot circuit can be, e.g., 10 pF to 10 nF.

Figure 4B:
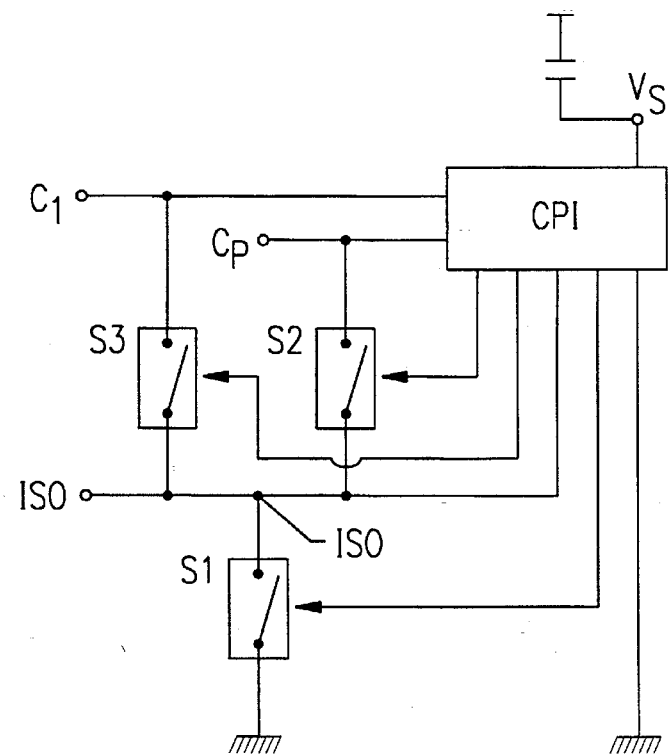
FIG. 4b shows the basic diagram of the dynamic isolation circuit in accordance with another class of embodiments of the present invention.

The circuit of FIG. 4b differs from that of FIG. 4a in that the reference potential for circuit CPI is taken from the ISO terminal instead of ground.

Figure 5:
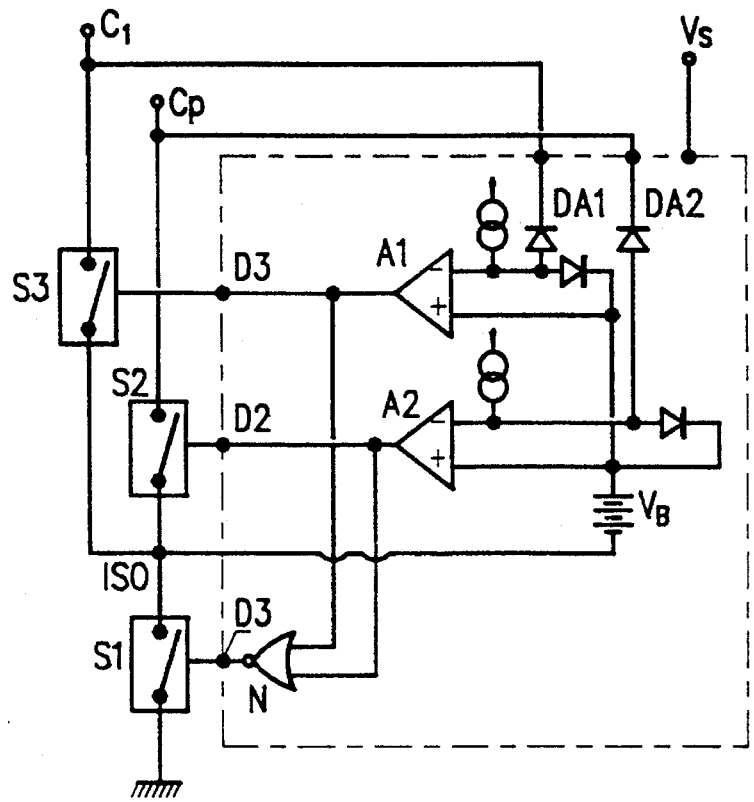
FIG. 5 shows the diagram of a realization circuit of the circuit CP of FIG. 4.

FIG. 5 shows a sample implementation of the circuit CP of FIG. 4a. In FIG. 5, A1 and A2 represent two voltage comparators, and "N" is a NOR logic circuit. The voltage generator VB compensates for the voltage drop on the diodes DA1 and DA2.

Figure 6:
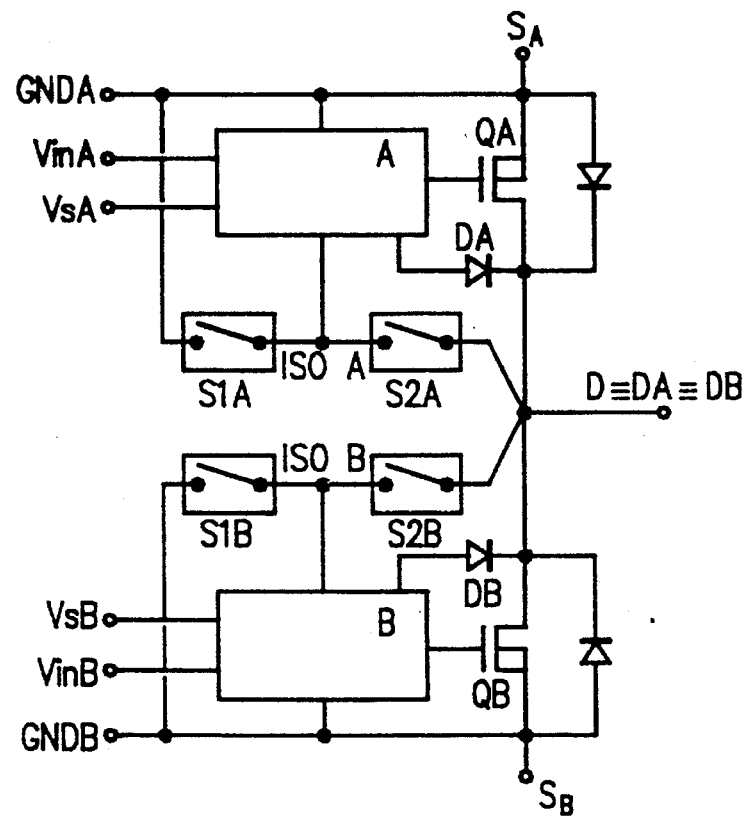
FIG. 6 shows the basic diagram of the dynamic isolation in accordance with the present invention applied to a solid state 2-way switch.

FIG. 6 shows the basic diagram of an embodiment wherein dynamic isolation in accordance with the present invention is applied to a solid state 2-way switch (QA/QB) integrated in a single semiconductor chip. In this diagram there are omitted for the sake of simplicity (in comparison with FIG. 5) the switches S3A and S3B for connection of the nodes ISO A and ISO B with the collector and drain terminals of the respective control circuits. The power switches QA and QB are piloted by appropriate circuits inserted also in the pilot circuits A and B respectively and designed to perform the above function.

In this case the two isolation regions of the control circuits of the power transistors QA and QB are not connected together, because their elementary components must be free to follow the potential imposed on SA and SB by two external sources.

To withstand the voltages applied (which may be on the order of several hundred volts) QA and QB are typically vertical transistors. Their drains (or collectors, if QA and QB are provided by bipolar transistors rather than the MOS transistors indicated in FIG. 6) coincide with the substrate of the semiconductor chip in which they are provided.

In a configuration of this type, if an AC voltage is applied between the two terminals SA and SB leading to the surface of the chip, the substrate will be alternately subjected to reversal, of polarity in relation to the local ground nodes.

Dynamic isolation in accordance with the invention will then provide that, on command of the pilot circuit A, the isolation ISO A of the control circuitry of the switch QA is alternately connected to the more negative local potential SA or to the potential D if it is more negative than SA. Similarly the isolation ISO B will always be taken upon command of the pilot circuit B to the lower of the potentials SB and D regardless of what happens for ISO A (in the figures GNDA and GNDB represent ground nodes, $V_{sA}$ and $V_{sB}$ separate power supplies, and VinA and VinB optional control inputs to synchronize piloting of QA and QB by means of an external logic circuit not shown in the figures).

In implementing the dynamic isolation principle in accordance with the present invention it is advantageous to provide at least the switch S1 with a metal gate NMOS transistor and with the channel region achieved by means of selective etching of a thick oxide layer grown on the surface of the slice followed by a subsequent growth of the gate oxide. Further advantages are achieved by providing both the switches S1 and S2 with metal gate NMOS transistors of the "double diffused" type, i.e. in which both the source region and the channel region are the diffused type (with the channel region having a nonuniform dopant concentration profile along the surface).

This manner of implementation of the switches S1 and S2 is advantageous for at least the following reasons:

the NMOS transistors switch faster than the parasitic bipolar transistor of the isolation structure, and consequently conduction of the latter transistor is not possible during switching, the channel length of a double diffused NMOS transistor is determined by the difference in the lateral diffusions of the source and body regions contrary to a transistor with uniform concentration channel region, for which the channel length is defined by a photolithographic process, the double diffused NMOS transistor is capable of withstanding high voltages.

Figure 7:
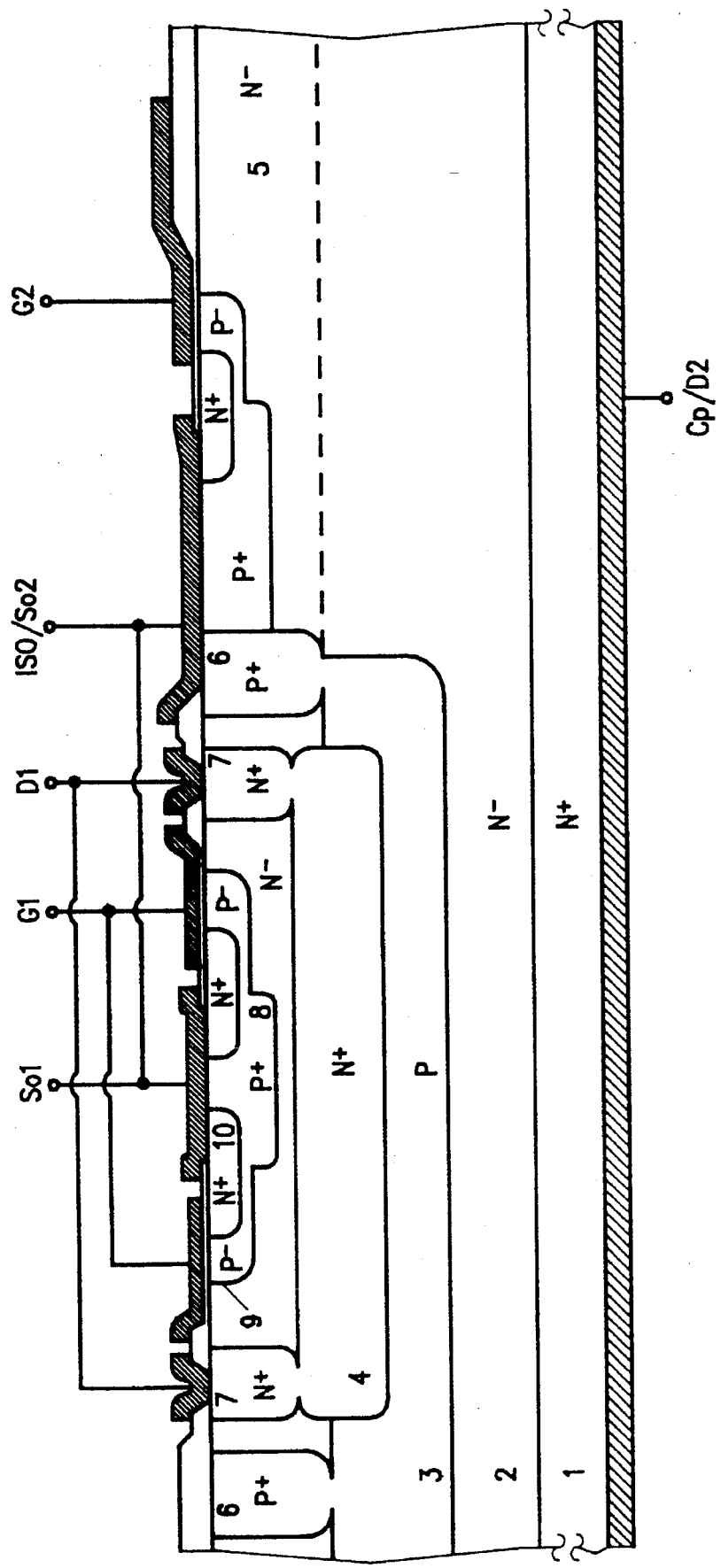
FIG. 7 shows a first example of a structure for realization of the switches S1 and S2 of FIGS. 4a and 4b, FIGS. 8 to 11 show phases of a process for realization of the structure of FIG. 7.
Figure 8:
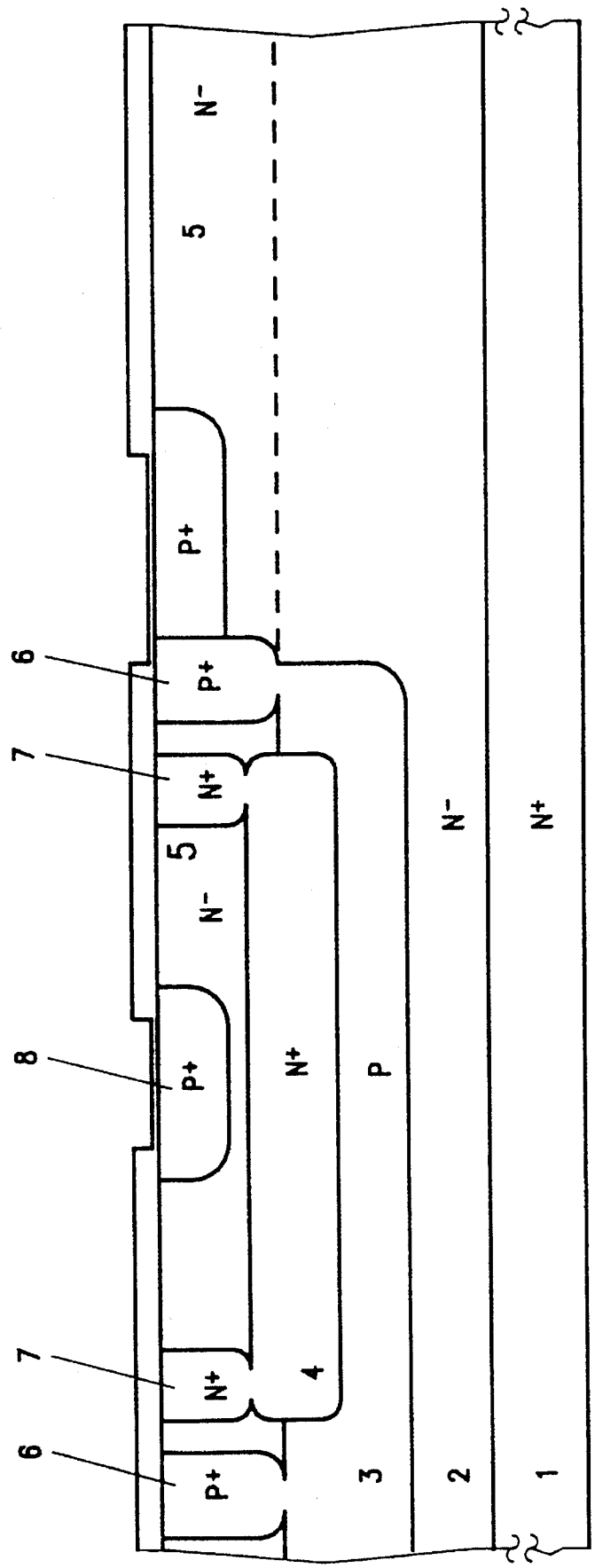

In FIG. 7 is illustrated an example of a structure implementing the switches S1 and S2 of FIG. 4a and 4b with metal gate NMOS transistors of the "double diffused" type and with channel region achieved beneath a thin oxide layer. In the figure So1, G1 and D1 represent the source, gate and drain terminals of the transistor implementing the switch S1 while So2, G2 and D2 represent the homologous terminals of the transistor implementing the switch S2.

Figure 9:
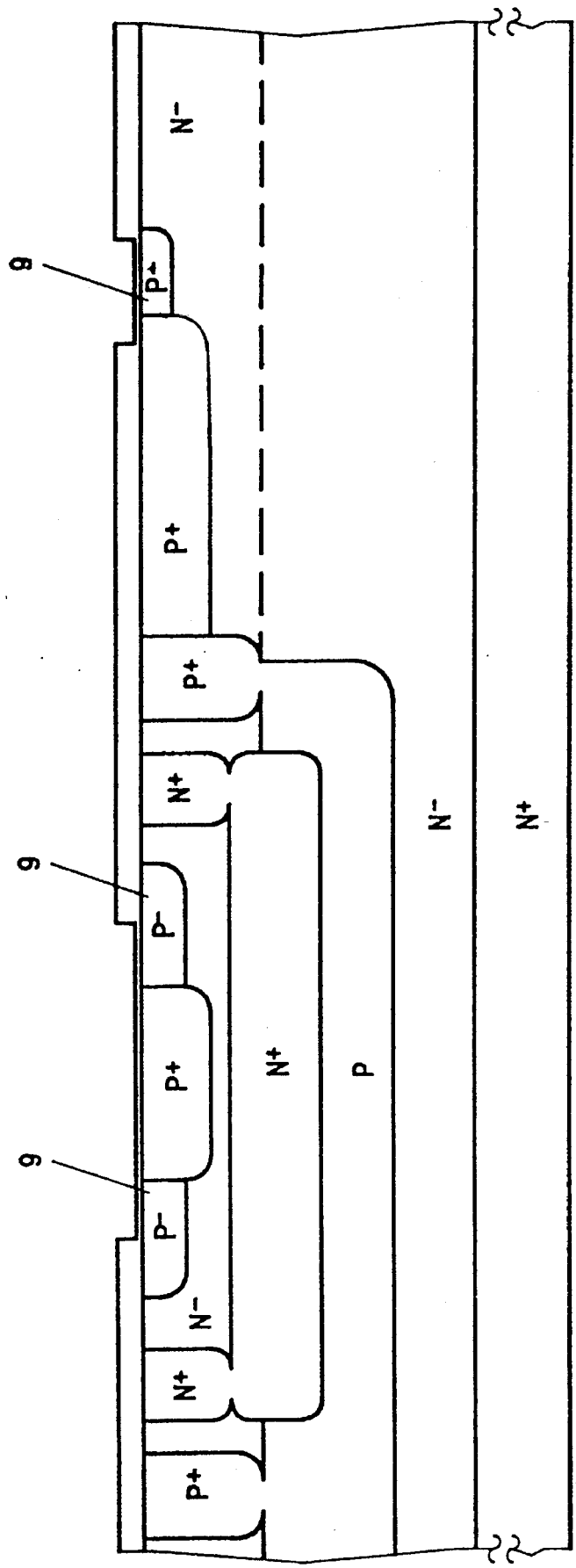
Figure 10:
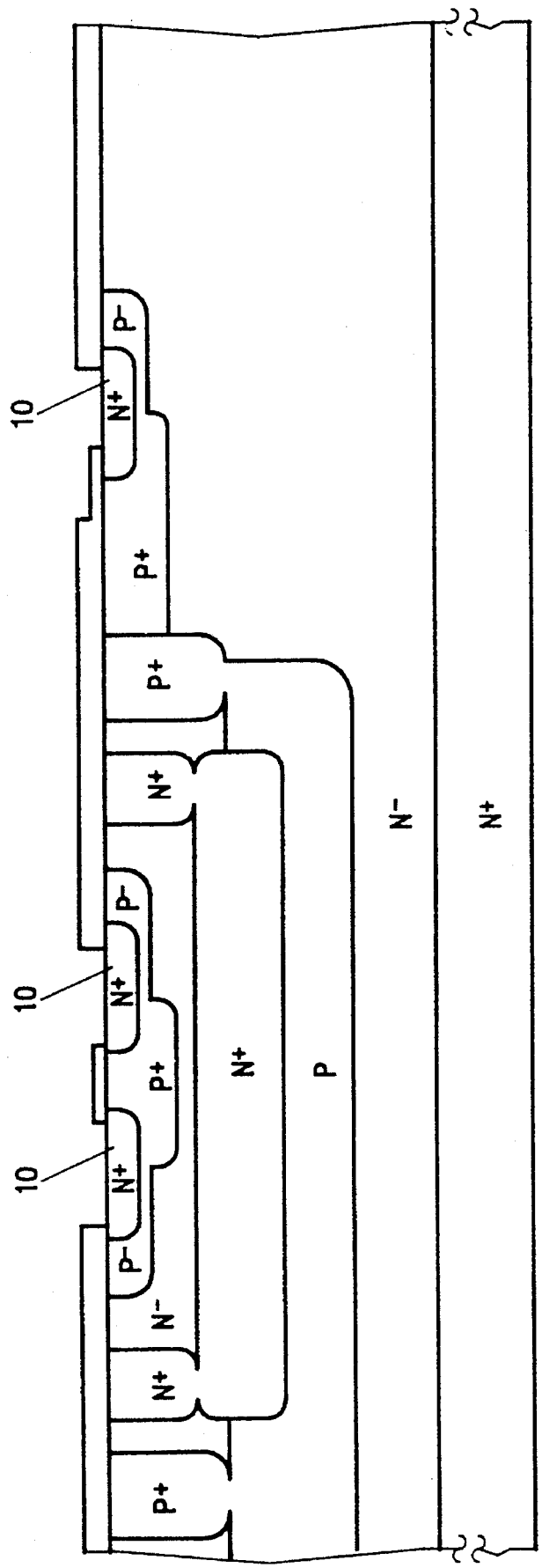
Figure 11:
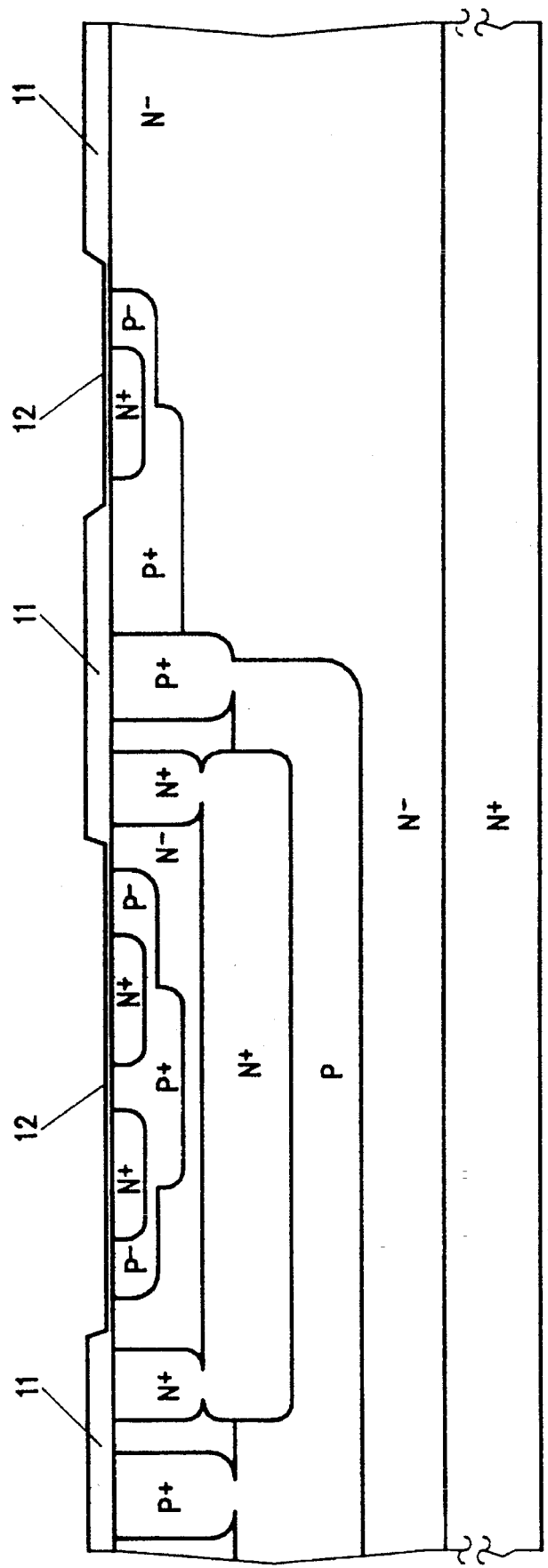

FIGS. 8 to 11 illustrate the processing sequence which consists of the following phases:

1) Growth of N− epitaxial layer 2 on a monocrystalline N+ substrate 1;

2) Formation of the P-type buried layer 3 (for isolation of the integrated control circuit), and of the shallower N+ buried layer 4 (for the collector region of an npn transistor of the integrated control circuit, or, in the specific example shown, for the low resistivity drain region of the NMOS transistor implementing S1);

3) Growth of a second N− epitaxial layer 5;

4) Definition of the P+ sinking contacts 6 (for contact to buried P-type region 3), and of n+ sinking contacts 7 (for connecting to the buried N+ region 4);

5) Formation of the deep body region 8 of the NMOS transistor (which coincides with the base region of the npn transistor of the integrated control circuit);

6) Formation of the body region 9 of the NMOS transistor (FIG. 9);

7) Formation of the source region 10 of the NMOS transistor, coinciding with the emitter region of the npn transistor of the integrated control circuit (FIG. 10), 8) Definition of the gate regions by selective etching of the thick oxide 11 and subsequently growth of the gate oxide 12 (FIG. 11); and 9) Opening of the contacts, provision of the metallization paths (with gate electrode function for the NMOS transistors in addition to interconnection of the device components) and finally metallization of the back thereof (FIG. 7).

Figure 12:
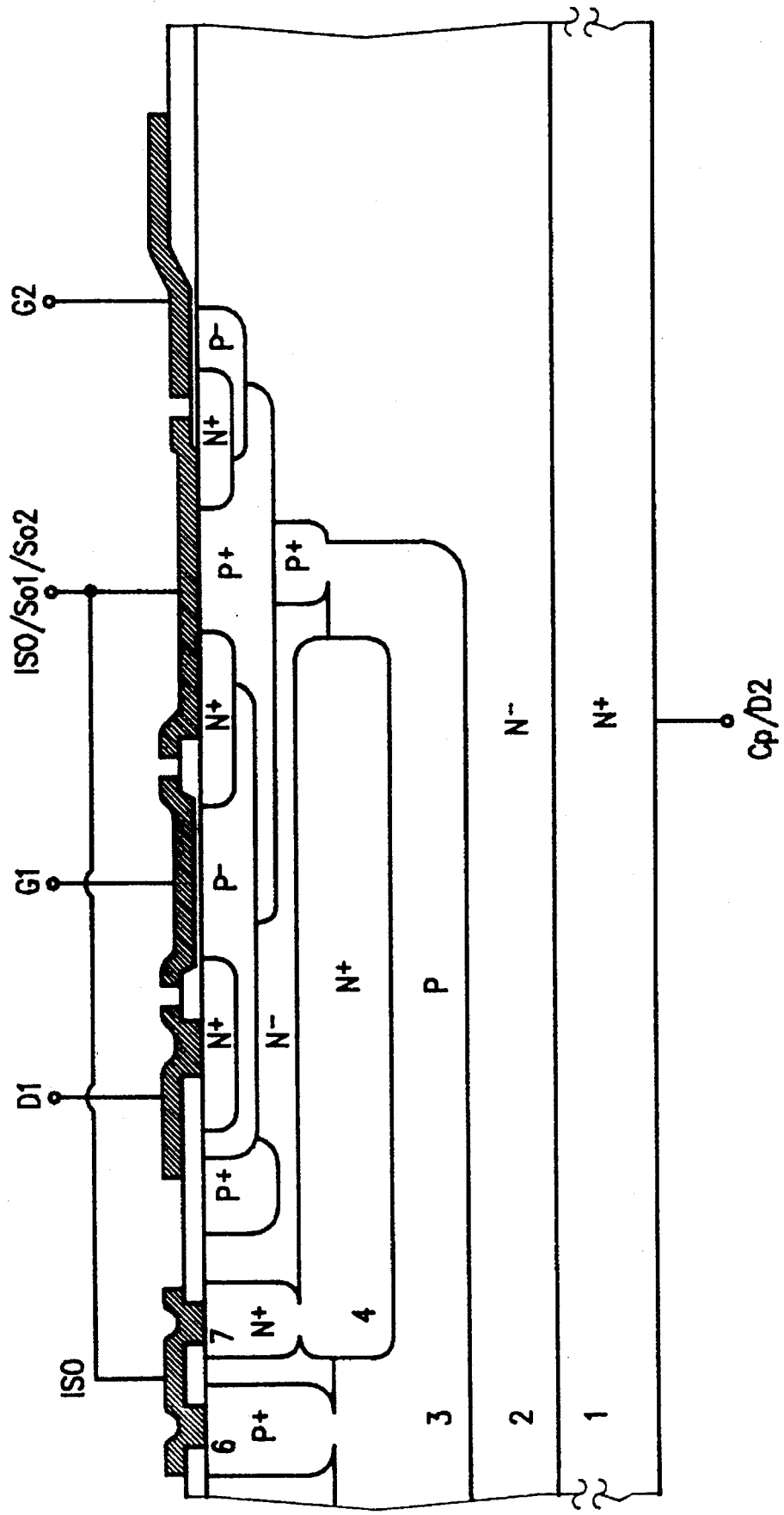
FIG. 12 shows a second example of a structure for realization of the switches S1 and S2 of FIGS. 4a and 4b.

Note that, since only the switch S2 is subject to high voltages, the switch S1 can even be provided (as exemplified in FIG. 12) by an NMOS transistor with uniform concentration channel region.

The process described above for the structure of FIG. 7 can be used in this case also, using a different layout for the deep body, body and source photomasking, for the NMOS transistor implementing S1: the source and drain of the NMOS transistor are formed by the same steps which form the emitter diffusion of the npn transistor of the integrated control circuit, and the buried type n layer is short-circuited with the channel region.

This variant of the structure in accordance with the present invention allows separate optimization of the channel regions of the two NMOS-FETs. (For example, it is possible to provide two different threshold voltages.)

One possible shortcoming of the NMOS structures could be the on-state series resistance $R_{on}$ of the high voltage transistor (switch S2). Indeed, it is known that unipolar devices do not enjoy the phenomenon of conductivity modulation, and therefore the voltage drop between source and drain of this transistor can be high.

Figure 13:
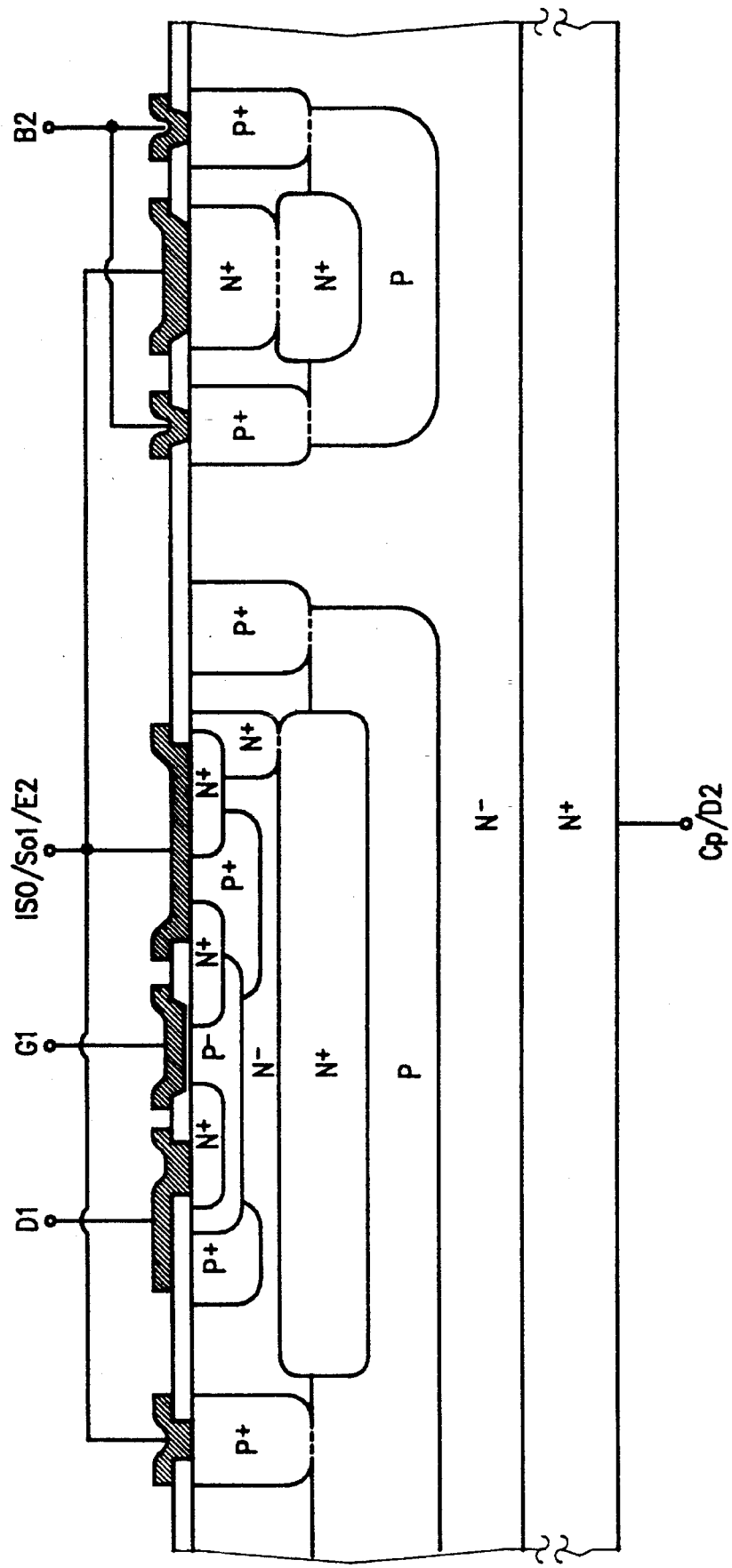
FIG. 13 shows a third example of a structure for realization of the switches S1 and S2 of FIG. 4.

Under these conditions it is possible that, when the voltage Vout of the terminal $C_p$ is negative (and hence S2 is closed), between it and the isolation is established a potential differential greater than necessary for turning on the parasitic bipolar transistor (approximately 0.5 V at 27° C.). Turning on the parasitic transistor is prevented by the present invention and in FIG. 13 is shown implementation of the switch S2 (of the circuit of FIG. 5) with a bipolar transistor and implementation of S1 with a metal gate NMOS transistor with a uniform concentration channel region.

In some sample contemplated chip embodiments, the specified peak voltage at $C_p$ would be in the range of 400–500 V, and specified peak voltage at $C_1$ would be in the range of 5–25 V.

The voltage applied to the isolation region differs from Vout (when Vout is negative) by one $V_{CESAT}$, i.e. a quantity less than that necessary to turn on the parasitic bipolar transistor associated with the isolation region. Thus, the size of vertical transistor S2 may be altered, as will be obvious to those of ordinary skill in the art, depending on the specified $V_{CESAT}$.

Figure 14:
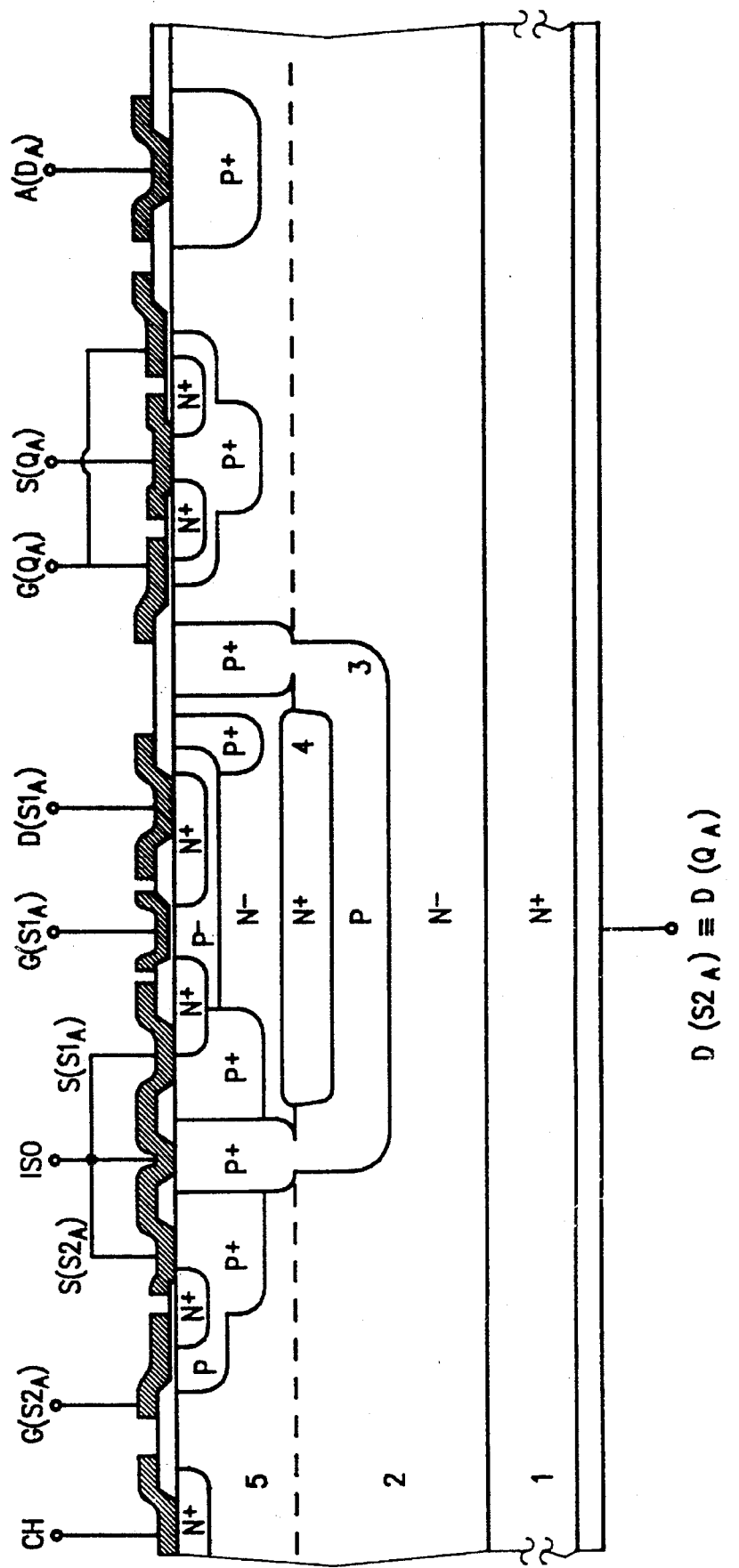
FIG. 14 shows an example of a structure for realization of some components of the circuit of FIG. 6.

In FIG. 14 is diagrammed a possible structure providing, in accordance with the above criteria, some components of the circuit of FIG. 6 (in particular the switch pair S1A and S2A, the switch QA, and the isolation region ISOA; the structure of the corresponding components S1B, S2B, QB and the region ISOB remains the same).

In the figures the meaning of the various symbols is as follows:

CH: channel stop region terminal

A: anode of DA;

the other abbreviations G( ), S( ), D( ) represent the gate, source and drain respectively of the transistor implementing the switch indicated in parentheses.

The drain terminal D(S1A) is grounded and the MOS transistor which provides the switch S1A, which in a state of conduction has the source region more positive that the drain region, can in this manner support the negative transistors in a state of interdiction without the drain-body diode of the transistor going into conduction.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

It is clear that to the examples of embodiments described above by way of non-limiting illustration can be made numerous modifications, adaptations, variants and replacements of elements by other functionally equivalent ones without thereby going beyond the protective scope of the claims set forth below.

One such variant could for example affect the circuits of FIGS. 4a and 4b since the switch S3 and the circuit CP (or CPI) can be connected with another region of the transistor instead of with the collector $C_1$ of the control circuit transistor.

For another example, it would of course be possible to reverse the supply polarity, and form a dual circuit and dual structure to that shown, with pnp devices replacing npn devices. (However, this would normally be much less preferable in silicon, due to the higher mobility of electrons as compared to holes.)

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
    at least one power transistor integrated in a monolithic body of semiconductor material with one or more small-signal transistors;
    at least one p-type isolation region interposed between said power transistor and at least one of said small-signal transistors;
    a first switch operable to connect said p-type isolation region to ground;
    a second switch operable to connect said p-type isolation region to an n-type region of said power transistor;
    a third switch operable to connect said p-type isolation region to an n-type region of said small-signal transistor;
    a pilot circuit operatively connected to said n-type region of said small-signal transistor, to said n-type region of said power transistor, to ground, and to said first, second, and third switches;
    wherein said pilot circuit monitors the voltage of said n-type regions of said power and small-signal transistors, and accordingly operates said switches to connect said p-type isolation region to the lowest voltage of: ground; said n-type region of said power transistor; and said n-type region of said small-signal transistor.

2. The integrated circuit of claim 1, wherein said first switch comprises a metal gate NMOS transistor.

3. The integrated circuit of claim 1, wherein said first switch comprises a double diffused NMOS transistor.

4. The integrated circuit of claim 1, wherein said second switch comprises a double-diffused thin-gate-oxide metal-gate NMOS transistor.

5. The integrated circuit of claim 1, wherein said first switch comprises a metal gate NMOS transistor having a laterally uniform channel dopant concentration.

6. The integrated circuit of claim 1, wherein said first switch comprises a metal gate NMOS transistor having a laterally uniform channel dopant concentration, and said second switch comprises a bipolar transistor.

7. The integrated circuit of claim 1, further comprising a capacitor connected to store charge and to provide power to said pilot circuit.

8. An integrated circuit, comprising:
    at least one power transistor integrated in a monolithic body of semiconductor material with one or more small-signal transistors;
    at least one p-type isolation region interposed between said power transistor and at least one of said small-signal transistors;
    a first switch operable to connect said p-type isolation region to ground;
    a second switch operable to connect said p-type isolation region to an n-type region of said power transistor;

a third switch operable to connect said p-type isolation region to an n-type region of said small-signal transistor;

a pilot circuit operatively connected to said n-type region of said small-signal transistor, to said n-type region of said power transistor, to ground, to said p-type isolation region, and to said first, second, and third switches;

wherein said pilot circuit monitors the voltage of said p-type isolation region and said n-type regions of said power and small-signal transistors, and accordingly operates said switches to connect said p-type isolation region to the lowest voltage of: ground; said n-type region of said power transistor; and said n-type region of said power transistor.

9. The integrated circuit of claim 8, wherein said first switch comprises a metal gate NMOS transistor.

10. The integrated circuit of claim 8, further comprising a capacitor connected to store charge and to provide power to said pilot circuit.

11. The integrated circuit of claim 8, wherein said first switch comprises a double diffused NMOS transistor.

12. The integrated circuit of claim 8, wherein said second switch comprises a double-diffused thin-gate-oxide metal-gate NMOS transistor.

13. The integrated circuit of claim 8, wherein said first switch comprises a metal gate NMOS transistor having a laterally uniform channel dopant concentration, and said second switch comprises a bipolar transistor.

14. The integrated circuit of claim 8, further comprising a capacitor connected to store charge and to provide power to said pilot circuit.

15. An integrated circuit including a solid state two-way switch, comprising:

first and second power transistors, each operable to connect a common substrate region, of a first conductivity type, to a respective other region of said first conductivity type;

a first control circuit operatively connected to control said first power transistor, and a second control circuit operatively connected to control said second power transistor;

said power transistors and control circuits all being integrated in a common body of monocrystalline semiconductor material, and said first power transistor being isolated from said first control circuit by a first isolation region, and said second power transistor being isolated from said second control circuit by a second isolation region; said isolation regions both having a second conductivity type;

said first and second control circuits comprising first and second pilot circuits respectively, each connected to first and second supply voltages, and to a respective one of said isolation regions, and to said power transistor and control circuit, and to three respective switches; wherein each said pilot circuit operates said three respective switches to connect said respective isolation region to the most extreme voltage of: said first supply voltage; said respective other region of said power transistor; and said respective control circuit.

16. The integrated circuit of claim 15, wherein a first one of said switches comprises a metal gate NMOS transistor.

17. The integrated circuit of claim 15, wherein a first one of said switches comprises a double diffused NMOS transistor.

18. The integrated circuit of claim 15, wherein a second one of said switches comprises a double-diffused thin-gate-oxide metal-gate NMOS transistor.

19. The integrated circuit of claim 15, wherein a first one of said switches comprises a metal gate NMOS transistor having a laterally uniform channel dopant concentration.

20. The integrated circuit of claim 15, wherein a first one of said switches comprises a metal gate NMOS transistor having a laterally uniform channel dopant concentration, and a second one of said switches comprises a bipolar transistor.

21. The integrated circuit of claim 15, wherein each pilot circuit comprises a NOR logic circuit whose output pilots a first switch of said switches, and a first and a second voltage comparator, whose "−" inputs are connected with said other region of said power transistor respectively, and whose "+" inputs are connected with said isolation region, and whose outputs pilot a third switch and a first input of said NOR circuit and a second switch and a second input of said NOR circuit respectively.

22. The integrated circuit of claim 15, further comprising a capacitor connected to store charge and to provide power to said pilot circuit.

23. An integrated circuit, powered by negative supply voltages and a positive ground connection, comprising:

at least one power transistor integrated in a monolithic body of semiconductor material with one or more small-signal transistors;

at least one n-type isolation region interposed between said power transistor and at least one of said small-signal transistors;

a first switch operable to connect said n-type isolation region to ground;

a second switch operable to connect said n-type isolation region to a p-type region of said power transistor;

a third switch operable to connect said n-type isolation region to a p-type region of said small-signal transistor;

a pilot circuit connected to said p-type region of said power transistor, to ground, and to said first, second, and third switches; wherein said pilot circuit operates said switches to connect said n-type isolation region to the highest voltage of: ground; said p-type region of said power transistor; and said p-type region of said small-signal transistor.

24. The integrated circuit of claim 23, wherein said first switch comprises a PMOS transistor having a laterally uniform channel dopant concentration, and said second switch comprises a bipolar transistor.

25. A method for operating an integrated circuit which includes at least one power transistor integrated in a monolithic body of semiconductor material with one or more small-signal transistors, and at least one p-type isolation region interposed between said power transistor and at least one of said small-signal transistors, comprising the steps of, in on-chip circuitry:

(a.) monitoring, substantially continually in a pilot circuit on the integrated circuit, the voltage of an N-type portion of the power transistor;

(b.) monitoring, substantially continually in a pilot circuit on the integrated circuit, the voltage of an N-type region of at least one of said small-signal transistors of the integrated circuit;

(c.) operating a first N-channel switching transistor, under control of said pilot circuit, to operatively connect said p-type isolation region to said N-type portion of the power transistor, at each instant, if and only if the voltage of said N-type portion of the power transistor is below ground; and (d.) operating a second N-channel switching transistor, under control of said pilot circuit, to operatively connect the p-type isolation region to said N-type portion of at least one of said small-signal transistors, at each instant, if and only if the voltage of said N-type portion of said small-signal transistor is below ground; and (e.) operatively connecting said p-type isolation region to ground at substantially all other times.

26. The method of claim 25, wherein said first N-channel switching transistor comprises a metal gate NMOS transistor.

27. The method of claim 25, wherein said first N-channel switching transistor comprises a double diffused NMOS transistor.

28. The method of claim 25, wherein said second N-channel switching transistor comprises a double-diffused thin-gate-oxide metal-gate NMOS transistor.

29. The method of claim 25, wherein said first N-channel switching transistor comprises a metal gate NMOS transistor having a laterally uniform channel dopant concentration.

30. A method for operating an integrated circuit, powered by negative supply voltages and a positive ground connection, which includes at least one power transistor integrated in a monolithic body of semiconductor material with one or more small-signal transistors, and at least one N-type isolation region interposed between said power transistor and at least one of said small-signal transistors, comprising the steps of, in on-chip circuitry:

(a.) monitoring, substantially continually in a pilot circuit on the integrated circuit, the voltage of a P-type portion of the power transistor;

(b.) monitoring, substantially continually in a pilot circuit on the integrated circuit, the voltage of a P-type region of at least one of said small-signal transistors of the integrated circuit;

(c.) operating a first P-channel switching transistor, under control of said pilot circuit, to operatively connect the N-type isolation region to said P-type portion of the power transistor, at each instant, if and only if the voltage of said P-type portion of the power transistor is above ground; and (d.) operating a second N-channel switching transistor, under control of said pilot circuit, to operatively connect the N-type isolation region to said N-type portion of at least one of said small-signal transistors, at each instant, if and only if the voltage of said N-type portion of the small-signal transistor is below ground; and (e.) operatively connecting the N-type isolation region to ground at substantially all other times.

* * * * *

UNITED STATES PATENT AND TRADEMARK OFFICE
CERTIFICATE OF CORRECTION

PATENT NO. : 5,475,273
DATED : December 12, 1995
INVENTOR(S) : Paparo et al.

It is certified that error appears in the above-indentified patent and that said Letters Patent is hereby corrected as shown below:

On the title page, add item [73]

Assignee: SGS-Thomson Microelectronics, S.r.l. (Agrate Brianza, Italy), and

Consorzio per la Ricerca sulla Microelettronica nel Mezzogiorno (Catania CT, Italy), jointly Signed and Sealed this Second Day of April, 1996

Attest:

BRUCE LEHMAN

*Attesting Officer*  *Commissioner of Patents and Trademarks*